United States Patent [19]

Ackerman

[11] Patent Number: 4,585,295
[45] Date of Patent: Apr. 29, 1986

[54] CIRCUIT BOARD EYELET-TYPE WIRE GRIPPER

[75] Inventor: Daniel W. Ackerman, Chenango Bridge, N.Y.

[73] Assignee: Universal Instruments Corporation, Binghamton, N.Y.

[21] Appl. No.: 612,547

[22] Filed: May 21, 1984

Related U.S. Application Data

[63] Continuation-in-part of Ser. No. 428,872, Sep. 30, 1982, abandoned.

[51] Int. Cl.$^4$ ............................................. H01R 13/11
[52] U.S. Cl. .............................. 339/258 R; 339/17 C; 339/95 D
[58] Field of Search ............... 339/17 C, 95 D, 258 R, 339/258 A, 258 P, 275 R, 275 B, 275 T

[56] References Cited

U.S. PATENT DOCUMENTS 3,208,028  9/1965  Mittler et al. ................... 339/258 P
3,778,755 12/1973  Marks .............................. 339/258 P

*Primary Examiner*—Joseph H. McGlynn
*Attorney, Agent, or Firm*—Fidelman, Wolffe & Waldron

[57] ABSTRACT

An eyelet is mountable to a circuit board by a snap-fit upon insertion into the circuit board from only one side. The eyelet has converging, flexible gripper legs between which a wire or electrical component lead may be inserted and retained in order to connect it mechanically to a conductive portion of the circuit board. More permanent attachment to the circuit board may be achieved by filling the eyelet with solder.

5 Claims, 10 Drawing Figures

CIRCUIT BOARD EYELET-TYPE WIRE GRIPPER

This application is a continuation-in-part of application Ser. No. 428,872, filed Sept. 30, 1982, now abandoned.

CROSS-REFERENCES TO THE PRIOR ART

U.S. Pat. No. 2,877,441—Narozny, TERMINAL PIN
U.S. Pat. No. 3,060,402—Olsson, et al., SOLDER WELL TERMINAL
U.S. Pat. No. 3,368,188—Olsson, WIRE GRIP CIRCUIT BOARD EYELET
U.S. Pat. No. 3,504,328—Olsson, CIRCUIT BOARD EYELET
U.S. Pat. No. 3,601,786—Brubaker, WIRE GRIP TERMINAL
U.S. Pat. No. 3,654,583—Mancini, CIRCUIT BOARD EYELET
U.S. Pat. No. 3,777,303—McDonough, HOLE LINER FOR PRINTED CIRCUIT BOARDS
U.S. Pat. No. 4,205,889—Rieman, PRINTED CIRCUIT AND FASTENER ASSEMBLIES, AND METHOD OF ASSEMBLING PRINTED CIRCUITS WITH MOUNTING ELEMENTS

BRIEF BACKGROUND AND SUMMARY OF THE INVENTION

The present invention relates to a wire gripper eyelet mountable in a circuit board such that electrical leads may be inserted into the eyelet and gripped therein to complete mechanical connection of the lead to a conductive portion of the circuit board. More permanent securement of the inserted lead may be accomplished by filling the eyelet and circuit pad with solder.

The present invention is specifically an improvement over prior art wire-gripping eyelets, such as those described and claimed in the above cross-referenced patents.

It is an object of the present invention to provide a new and improved wire-gripping eyelet.

It is another object of the present invention to provide a new and improved wire-gripping eyelet adapted for securement in the hole of a circuit board by insertion of the eyelet into the hole from only one side of the circuit board.

It is a further object of the present invention to provide a new and improved wire-gripping eyelet formed from relatively thin sheet metal stock which, during forming thereof, is provided with a unique reinforcing structure providing structural strength to the finished eyelet without substantially reducing the orifice into which an electrical lead is to be inserted.

Still further, it is an object of this invention to provide a wire gripping eyelet which increases gripping force on a lead when an attempt is made to withdraw the lead.

Additionally, it is an object of the invention to insure proper gripping of a lead entering the eyelet at an angle to the central axis thereof.

These and other objects are achieved in accordance with the present invention and will become more readily apparent from the following description.

The eyelet is particularly suited to be secured to a circuit board substrate or the like by insertion into a hole of the circuit board and includes a head portion and suitable means for receiving and gripping one or more electrical leads such that mechanical connection of the leads to a conductive track of the circuit board is attained. A major advantage over prior art wire-gripping eyelets is achieved by the structure of the instant invention, namely, that the eyelets are insertable into circuit board holes from only one side of the circuit board and are provided with a snap-fit therein for securement to the circuit board without the need for staking or the like from the other side of the circuit board.

In one embodiment, the particular means for providing the snap-fit also provides a wire-gripping function by a unique structural arrangement of resilient legs depending from a head portion, wherein the resilient legs have keeper portions which, after passing through the circuit board, spring out to a locking position. The gripper portions of the legs are arranged such that they converge toward the central axis of the hole from the keeper portions thereof to resiliently receive the electrical leads from one direction and to grip and prevent extraction of the leads from the other direction.

DETAILED DESCRIPTION OF THE INVENTION

Figure 1:
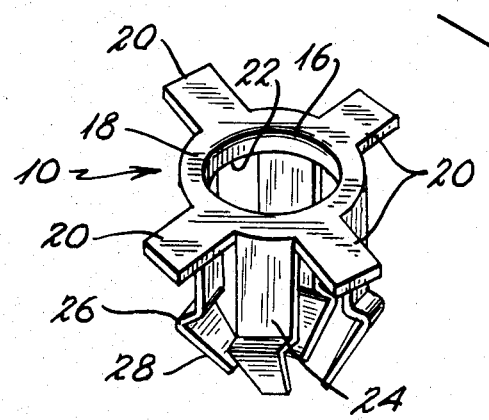
FIG. 1 is an isometric view of the inventive device about to be mounted in the hole of a circuit board.
Figure 1:
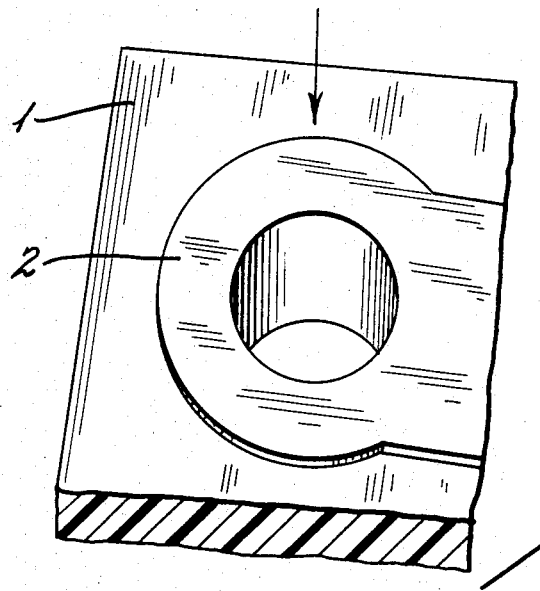
Figure 2:
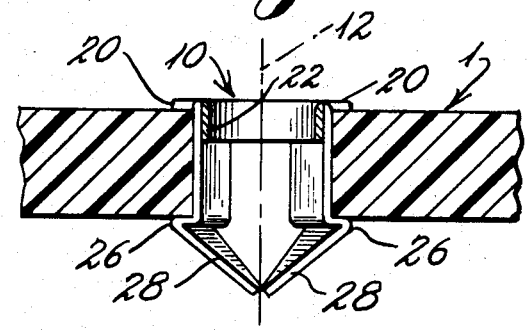
FIG. 2 is a cross-sectional view of the eyelet of the invention after mounting in a circuit board hole and prior to reception and gripping of a component lead.
Figure 3:
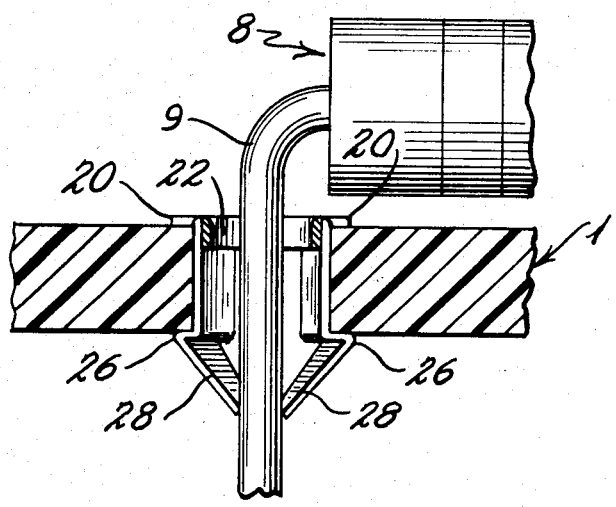
FIG. 3 is a cross-sectional view illustrating the inventive eyelet mounted in a circuit board with a component lead received and gripped therein.
Figure 6:
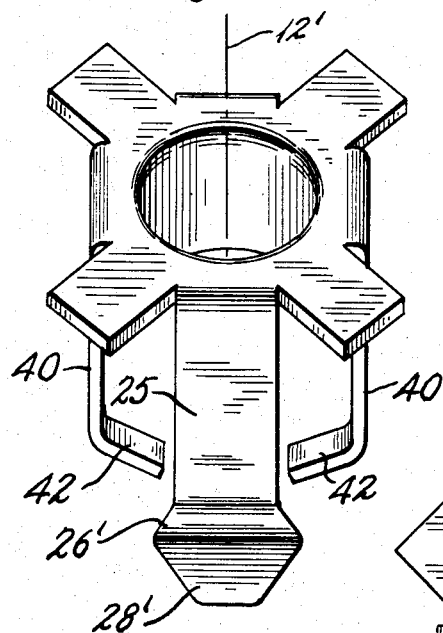
FIG. 6 is an isometric view of an alternate wire gripper structure.
Figure 7:
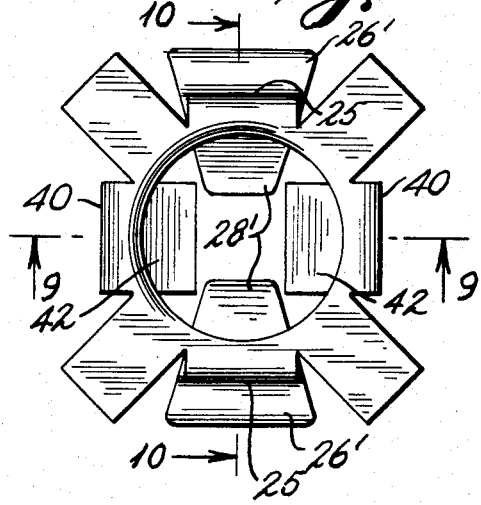
FIG. 7 is a top plan view of the device of FIG. 6.
Figure 8:
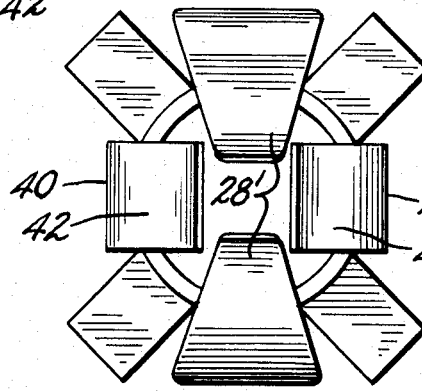
FIG. 8 is a bottom plan view of the device of FIG. 6.
Figure 9:
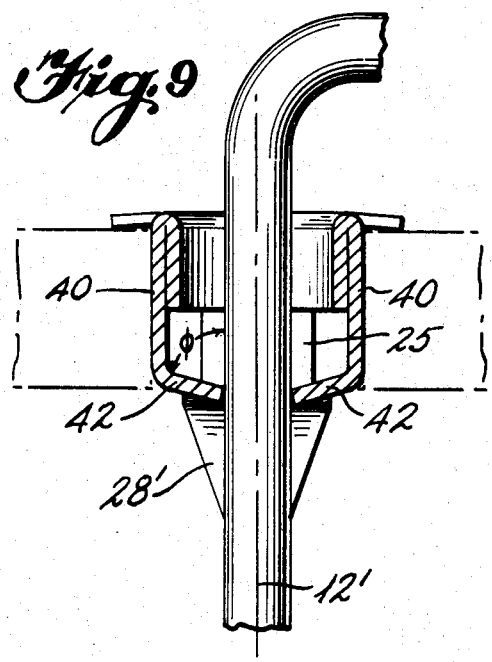
FIG. 9 is a sectional as viewed generally in the direction of arrows 9—9 of FIG. 7.

In FIG. 1, wire gripper eyelet 10 is mountable in the hole of a circuit board 1 from one side only, with mounting of the eyelet 10 accomplished by moving it in the generaly direction of the arrow of FIG. 1. In FIGS. 1-3, it may be seen that eyelet 10 comprises a head portion having a central aperture 16 surrounded by an edge 18 from which support tabs 20 radially protrude away from a central axis 12. A plurality of legs 24 extend downwardly from the head portion of eyelet 10 and are formed outwardly to provide keeper portion 26 and back inwardly to terminate in gripper portions 28. Legs 24 are slightly canted outwardly from central axis 12 from top to bottom and, due to the natural resiliency of the relatively thin sheet metal stock from which the eyelet 10 is formed, flex inwardly during insertion into the circuit board and snap outwardly to lock the device to the circuit board by means of keeper portions 26 as best seen in FIGS. 2 and 3. Prior to insertion of eyelet 10 into the circuit board hole, gripper portions 28 are spaced apart as seen in FIG. 1 and, upon insertion into the circuit board, are closer together as viewed in FIG.

2 in order to provide a good gripping action of a component lead or conducting wire when inserted therebetween. FIG. 3 shows such a lead 9 of an electrical component 8 inserted through eyelet 10 such that gripper portion 28 readily receives lead 9 from one direction and prevents removal therefrom in an opposite direction.

As may be appreciated from FIGS. 2 and 3, eyelet 10 is constructed to grip the circuit board 1 as well as component lead 9, due to the provision of support tabs 20 and keeper portions 26, such that a snap fit is provided with the circuit board. The particular structure of eyelet 10 allows it to be mounted by insertion from one side only of the circuit board without the need for additional staking tools or the like on the opposite side of the circuit board. An additional important feature is incorporated into the instant invention, namely, lip 22 which is formed on the inside of aperture 16 so as to provide a generally tubular reinforcing collar to the eyelet so as to prevent a general collapse of legs 24 and loss of their snap-fit capabilities. During manufacture of the eyelet 10, aperture 16 is preformed and thereafter lip 22 is extruded prior to forming or bending of legs 24. Extruding of lip 22 causes a stretching and thinning of the material thereof such that the cross-section of lip 22 is less than the cross-section of a leg 24. This thinning or stretching of lip 22 provides the largest available aperture 16 while not detracting from the reinforcing function of lip 22. Additionally, during forming of legs 24 into the finished product, lip 22 prevents tearing of the thin sheet metal stock at the juncture of edge 18 and support tabs 20, such that the finished eyelet 10 may be reliably manufactured.

Figure 4:
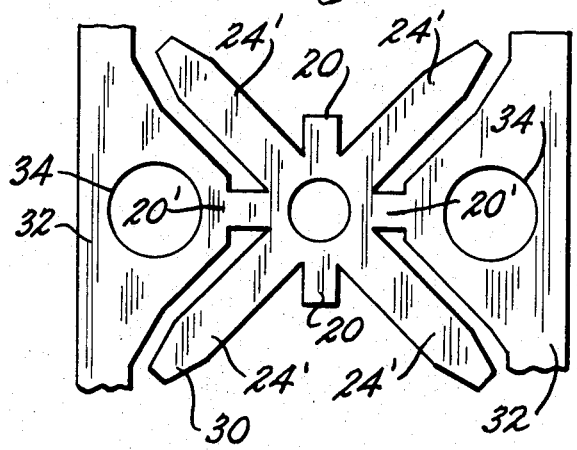
FIG. 4 is a top plan view illustrating the inventive eyelet still mounted on feed strips prior to bending of the legs and forming of the keeper portions thereof.
Figure 5:
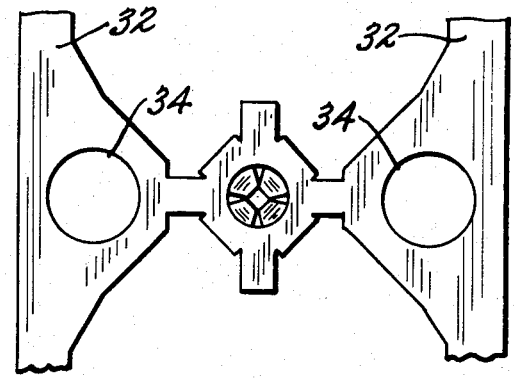
FIG. 5 is a top plan view, similar to that of FIG. 4, with the legs bent to form the gripper and keeper portions thereof and ready for removal from the feed strips.

FIGS. 4 and 5 disclose the eyelet during several steps of manufacture thereof. As seen in FIG. 4, the unbent leg portions 24' have tapered portions 30 such that, upon insertion of the finished eyelet 10 into the circuit board, the gripper portions 28 may converge closely toward central axis 12. As seen in FIGS. 4 and 5, feed strips 32 have indexing holes 34 and support eyelet 10 by two tabs 20' which later comprise two of the support tabs 20 of the finished device.

Although eyelet 10 is illustrated to have four legs 24 throughout the drawings, it is contemplated that more legs 24 may be provided, but that there must be at least two legs 24 in order that the described snap-fit may occur during mounting thereof.

Other forms of support than support tabs 20 are also contemplated. However, the illustrated support tabs 20 provide a generally smooth, flat fit with the top of the circuit board.

Keeper portions 26 extend outwardly from unformed leg portions 24' such that the necessary strength is imparted to keeper portions 26 and to gripper portions 28. The particular structure of gripper portions 28 also aids in guiding of eyelet 10 into the circuit board hole.

Another embodiment of the invention is illustrated in FIGS. 6–10, in which legs 25 having keeper portions 26' and gripper portions 28' are very similar to the legs of FIGS. 1–5, with the additional provision that legs 25, when in the unformed condition similar to that of FIG. 4, have arrow head-shaped tips such that keeper portions 26' are widened to provide greater surface contact with the bottom of the circuit board. Legs 40 have gripper portions 42 and are not provided with keeper portions to engage the bottom of the circuit board. As may be seen in FIG. 9, gripper legs 40 do not extend past the bottom surface of the circuit board so that a stiffer moment arm is provided. It is also contemplated that legs 40 may extend past the bottom surface of the circuit board, although increased resistance to withdrawal of the lead which is inserted into the eyelet is thought to be provided by the structure of FIG. 9.

Figure 10:
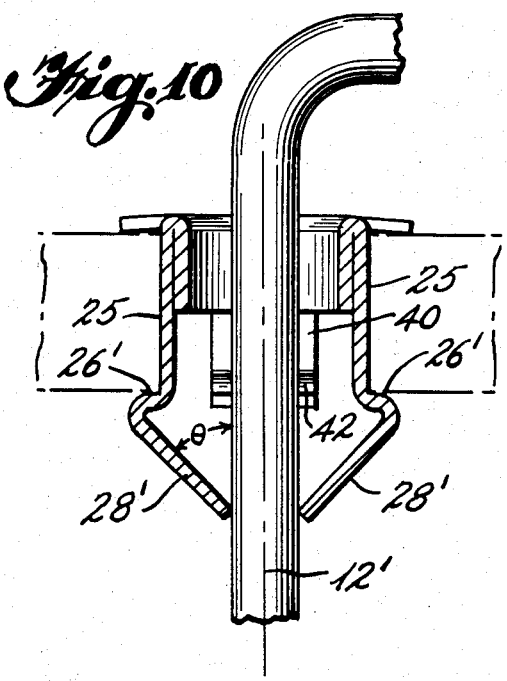
FIG. 10 is a sectional as viewed generally in the direction of arrows 10—10 of FIG. 7.

The gripper portions 28 of FIGS. 1–5 form an angle with the central axis of the eyelet of about 45° prior to insertion of a lead thereinto. Upon such insertion of a lead, grippers 28 are caused to flex downwardly such that this angle becomes about 30° and is not particularly self-tightening on the lead during attempts to withdraw the lead therefrom. The legs 28' of FIG. 10 are also shown as being at an angle of about 45° to the central axis of the eyelet, although it is contemplated herein that could be greater than 45°. Of particular importance is the angling of gripper portions 42 illustrated in FIG. 9. The angle is about 90° so that, when a lead is inserted and gripped between gripper portions 42, the resulting angle will be in a range of about 90°–45°. It has been found that such an arrangement provides self tightening of gripper portions 42 upon the lead if withdrawal thereof is attempted. The arrangement of FIGS. 6–10 has been found to be particularly advantageous over that of FIGS. 1–5 when a lead is inserted at an angle to the central axis. In the device of FIGS. 1–5, the lead could pass between adjacent legs 24 without being adequately gripped by gripper portions 28. With the alternate embodiment, there is no such possibility that an angled lead to which the eyelet has been properly dimensioned may pass between adjacent legs. Typical of dimensions involved in the above described invention are: 0.078 in. for the size of the hole in the printed circuit board; 0.029 in. for the width of the leg 25; 0.035 in. for the width of leg 40; wherein leads ranging in size from 24 AWG—20 AWG are to be gripped.

It will thus be seen that the object set forth above, among those made apparent from the preceding description, are efficiently attained and, since certain changes may be made in carrying out the above construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

I claim:

1. An eyelet formed from relatively thin sheet metal stock, insertable into the hole of a circuit board so as to receive the lead of a component to be soldered into place on the circuit board and having a central axis, said hole communicating a top and a bottom of said circuit board, said eyelet comprising:

means for attaching said eyelet to said circuit board by a snap-fit upon insertion of said eyelet into said hole, said attaching means comprising a head portion having an aperture and surrounding edge, and a lip portion extending into said board from said edge to provide a generally tubular reinforcing collar of said eyelet, said aperture generally centered on said central axis, and support tabs extending radially outwardly from said edge so as to engage said top and limit a depth of insertion of said eyelet into said hole, and legs depending from said head portion and insertable into said hole, each of said legs having a keeper portion engageable with said bottom by a snap-fit; and primary and secondary means for gripping a lead inserted into said eyelet to provide at least mechanical connection of said lead to said conductive portion, said secondary gripping means comprising at least two said legs having said keeper portions.

2. An eyelet as in claim 1, wherein said hole has a diameter and wherein:

said keeper portions extend radially outwardly from said axis and snap outwardly beyond said hole diameter upon insertion through said hole due to a resiliency of said legs; and said secondary gripping means comprises gripper portions extending radially inwardly from said keeper portions to yieldably allow insertion of said lead therebetween to grip and prevent withdrawal of said lead therefrom.

3. An eyelet as in claim 1, wherein said primary gripping means comprises:

means for increasing a gripping force on said inserted lead upon attempts to withdraw said lead from said eyelet.

4. An eyelet formed from relatively thin sheet metal stock, insertable into the hole of a circuit board so as to receive the lead of a component to be soldered into place on the circuit board and having a central axis, said hole communicating a top and a bottom of said circuit board, said eyelet comprising:

means for attaching said eyelet to said circuit board by a snap-fit upon insertion of said eyelet into said hole, said attaching means comprising a head portion having an aperture and surrounding edge, said aperture generally centered on said central axis, and support tabs extending radially outwardly from said edge so as to engage said top and limit a depth of insertion of said eyelet into said hole, and legs depending from said head portion and insertable into said hole, each of said legs having a keeper portion engageable with said bottom by a snap-fit; and primary and secondary means for gripping a lead inserted into said eyelet to provide at least mechanical connection of said lead to said conductive portion, said secondary gripping means comprising at least two said legs having said keeper portions, said primary gripping means comprising at least two other legs each having a first portion extending into said hole generally parallel to said central axis and a second portion angling away from said first portion and generally radially inwardly before clearing said bottom to provide a primary gripper portion engageable with said lead and forming a primary angle with said central axis, at least part of said primary gripping means binding against an internal surface of said hole in order to increase engagement of said primary gripper portion with said lead during attempted withdrawal of said lead from said eyelet.

5. An eyelet as in claim 4, wherein said primary angle is generally in the range of about 45° to about 90° such that, with insertion of a lead from said top into gripping engagement with said eyelet, said primary gripper portions are flexible in one direction to permit said insertion and are self-tightening upon said lead in another direction to prevent withdrawal of said lead therefrom.

* * * * *